United States Patent
Lapiere et al.

(10) Patent No.: US 11,255,912 B2
(45) Date of Patent: Feb. 22, 2022

(54) ELECTRICAL SWITCHING DEVICE AND METHOD FOR DETECTING ASSOCIATED WEAR

(71) Applicant: Schneider Electric Industries SAS, Rueil Malmaison (FR)

(72) Inventors: Christophe Lapiere, Grenoble (FR); Lionel Urankar, Fontaine (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 901 days.

(21) Appl. No.: 16/028,476

(22) Filed: Jul. 6, 2018

(65) Prior Publication Data

US 2019/0018065 A1    Jan. 17, 2019

(30) Foreign Application Priority Data

Jul. 13, 2017   (FR) ...................................... 1756682

(51) Int. Cl.
*G01R 31/327*   (2006.01)
*H01H 71/04*   (2006.01)
(Continued)

(52) U.S. Cl.
CPC ..... *G01R 31/3274* (2013.01); *G01R 31/3278* (2013.01); *H01H 1/0015* (2013.01);
(Continued)

(58) Field of Classification Search
None
See application file for complete search history.

(56) References Cited

U.S. PATENT DOCUMENTS 2,864,054 A   12/1958 Boyle et al.
4,159,446 A   6/1979 Darrel et al.
(Continued)

FOREIGN PATENT DOCUMENTS

DE         195 44 926 C1    4/1997
DE    10 2010 043 744 A1    5/2012
(Continued)

OTHER PUBLICATIONS

French Preliminary Search Report dated May 9, 2018 in French Application 17 56682 filed on Jul. 13, 2017 (with English Translation of Categories of Cited Documents and Written Opinion).
(Continued)

*Primary Examiner* — Patrick Assouad
*Assistant Examiner* — Haidong Zhang
(74) *Attorney, Agent, or Firm* — Oblon, McClelland, Maier & Neustadt, L.L.P.

(57) ABSTRACT

An electrical switching device including an input connection land, an output connection land, and a connection member that is capable of switching between a closed position allowing an electric current to flow between the input and output connection lands and an open position preventing the flow of the current between the input and output connection lands. The electrical switching device includes an accelerometer that is capable of measuring a component of an acceleration of the switching device when switching the connection member between the closed and open positions and a control configured to estimate, on the basis of an acceleration measurement signal delivered by the accelerometer, a duration of switching of the connection member between the closed and open positions, and to determine wear on the switching device on the basis of the estimated switching duration.

12 Claims, 5 Drawing Sheets

(51) Int. Cl.
*H01H 1/00* (2006.01)
*H01H 11/00* (2006.01)
(52) U.S. Cl.
CPC ........ *H01H 11/0062* (2013.01); *H01H 71/04* (2013.01); *G01R 31/3275* (2013.01); *H01H 2071/044* (2013.01)

(56) References Cited

U.S. PATENT DOCUMENTS

| | | |
|---|---|---|
| 4,620,156 A | 10/1986 | Alvin et al. |
| 4,975,800 A | 12/1990 | Oshita et al. |
| 6,215,408 B1 | 4/2001 | Leonard et al. |
| 8,688,391 B2 | 4/2014 | Elsner et al. |
| 2004/0189319 A1 | 9/2004 | Stanisic et al. |
| 2005/0104699 A1* | 5/2005 | Bataille ............ H01H 57/00 335/222 |
| 2005/0237064 A1 | 10/2005 | Kwark |
| 2007/0120567 A1 | 5/2007 | Hagel et al. |
| 2008/0036561 A1* | 2/2008 | Hartinger ............ H01H 1/0015 335/156 |
| 2009/0144019 A1 | 6/2009 | Elsner et al. |
| 2014/0090965 A1 | 4/2014 | Leccia et al. |
| 2017/0047186 A1 | 2/2017 | Chen et al. |

FOREIGN PATENT DOCUMENTS

| | | |
|---|---|---|
| DE | 20 2017 002 030 U1 | 6/2017 |
| EP | 0 333 139 A1 | 9/1989 |
| EP | 1 006 537 A1 | 6/2000 |
| EP | 1 793 235 A1 | 6/2007 |
| EP | 2 200 055 A1 | 6/2010 |
| EP | 2 975 622 A1 | 1/2016 |
| FR | 2 792 766 A1 | 10/2000 |
| FR | 2 919 109 A1 | 1/2009 |
| JP | 57-151829 | 9/1982 |
| WO | WO 02/023207 A1 | 3/2002 |

OTHER PUBLICATIONS

French Preliminary Search Report dated May 9, 2018 in French Application 17 56682 filed on Jul. 13, 2017 (with English Translation of Categories of Cited Documents and Written Opinion).

* cited by examiner

ELECTRICAL SWITCHING DEVICE AND METHOD FOR DETECTING ASSOCIATED WEAR

The present invention concerns an electrical switching device and an associated wear detection method.

Switching devices are used in a great number of applications to control the passage of an electrical current. For example, switching devices, such as contactors, are used to power as required electrical installations or portions of an electricity distribution network. Such switching devices are generally controlled remotely via a cable or radiofrequency communication module. Other types of switching device, such as circuit breakers, are configured to detect an electrical incident, for example a short-circuit, a voltage surge or a voltage drop, and to interrupt the passage of the current automatically, without external intervention.

The aforementioned switching devices are therefore important elements for the correct functioning of electrical installations or electrical networks, since their failure can lead to serious electrical hazards if the passage of the current is not interrupted correctly or to the contrary prevent correct supply of electrical power to the installations to be powered.

Now, during their service life, switching devices are subjected to numerous switching cycles, which necessarily lead to wear, in particular of the mobile parts of the device or contact pads. Such wear is liable to lead to a malfunction of the switching device and in particular to inadequate or even impossible switching if heating leads to the welding of a mobile contact to a connection land.

Switching devices equipped with means for evaluating the remaining service life of the mobile parts of the device exist and enable preventive maintenance or even replacement of the worn parts before the wear leads to failure of the device. However, the evaluation means used are not optimized. In particular, the evaluation means are suitable for only certain particular switching device types or certain causes of wear.

For example, the document WO 0063932 A1 describes a switching device in which an electrical contact is diagnosed by measuring an electrical voltage between two electrical contacts. However, although this kind of measurement is easy in low-voltage devices, it is not very suitable for higher voltage networks, for example 380 Volt or higher networks.

An object of the invention is to propose an electrical switching device enabling improved detection of wear of the mobile parts of the switching device.

To this end, the invention consists in an electrical switching device comprising at least one input connection land, at least one output connection land, and at least one connection member capable of switching between a closed position allowing an electric current to flow between the input and output connection lands and an open position preventing the flow of the electrical current between the input and output connection lands, the electrical switching device including an accelerometer capable of measuring at least one component of an acceleration of the electrical switching device when switching the connection member between the closed position and the open position and a control configured to estimate, on the basis of at least one acceleration measurement signal delivered by the accelerometer, a duration of switching the connection member between the closed position and the open position and to determine wear on the electrical switching device on the basis of at least the estimated switching duration.

According to other advantageous but not obligatory aspects of the invention, the switching device comprises one or more of the following features, separately or in any technically feasible combination:

the control is configured to determine wear on the switching device if the switching duration is greater than or equal to a predetermined threshold;

the control is configured to verify if the determined wear is greater than a predetermined wear threshold and if so to generate a detection signal intended for a user of the electrical switching device;

the electrical switching device includes a casing for electrically insulating the connection member from the exterior of the casing, the connection member being mobile relative to the casing between its open position and its closed position, and the accelerometer is fastened to the casing;

the electrical switching device includes a casing for electrically insulating the connection member from the exterior of the casing, the connection member being mobile relative to the casing between its open position and its closed position, and the accelerometer is fastened to the connection member and consequently mobile relative to the casing;

the control is configured to detect, when the connection member switches between the closed position and the open position, a start of travel time and an end of travel time of the travel of the connection member and to estimate the switching duration on the basis of the detected start of travel and end of travel times;

the control is configured to compare the amplitude of the acceleration measurement signal to a first threshold and to detect the start of travel time if the amplitude overshoots the first threshold;

the control is configured to compare the amplitude of an acceleration measurement signal to a second threshold and to detect the end of travel time if, after a start of travel time has been detected, the amplitude becomes greater than or equal to the second threshold;

the connection member comprises a connection element and an actuator, the connection element being mobile relative to the connection lands between a first position and a second position and being configured to connect electrically the two connection lands when the connection element is in the first position and to disconnect electrically the two connection lands when the connection element is in the second position, the actuator including at least one part mobile relative to the connection lands between a third position and a fourth position, the mobile part being in the third position and the connection element being in the first position when the connection member is in the closed position, the mobile part being in the fourth position and the connection element being in the second position when the connection member is in the open position, the mobile part being configured to be at a distance from the connection element when the mobile part is in the third position and being configured, during its movement from the third position to the fourth position, to come to bear against the connection element to move the connection element from the first position to the second position, the control being furthermore configured to detect on the basis at least of the acceleration measurement signal an end of bearing time of the mobile part against the connection element, the wear being determined furthermore on the basis of the detected end of bearing time;

the acceleration measurement signal comprises a set of frequency components each having an intensity, the control being configured to detect the end of bearing time when, over a continuous range of frequencies having a predetermined frequency width, the intensity of each frequency component is greater than or equal to a third predetermined threshold;

the switching device is a contactor.

The invention also consists in a wear detection method for an electrical switching device comprising an accelerometer, at least an input connection land, an output connection land and a connection member, capable of switching between a closed position allowing an electrical current to flow between the input and output connection lands and a closed position preventing the flow of the electrical current, the method including the steps of:

switching the connection member between the closed position and the open position, the accelerometer generating an acceleration measurement signal corresponding at least to a component of an acceleration of the switching device during switching, estimating on the basis of the acceleration measurement signal a switching duration of the connection member between the closed position and the open position, and determining wear of the switching device on the basis at least of the estimated switching duration.

According to an advantageous but not obligatory aspect of the invention, the method further comprises a calibration step consisting in generating an acceleration measurement signal during at least one switching operation and identifying in the acceleration measurement signal supplied by the accelerometer at least one signature of a start of travel or end of travel time of the connection member, the estimation step including the detection of a start of travel time or an end of travel time of the connection member by comparing the acceleration measurement signal generated during the generation step with the identified signature.

Features and advantages of the invention will become apparent on reading the following description given by way of nonlimiting example only and with reference to the appended drawings in which.

Figure 1:
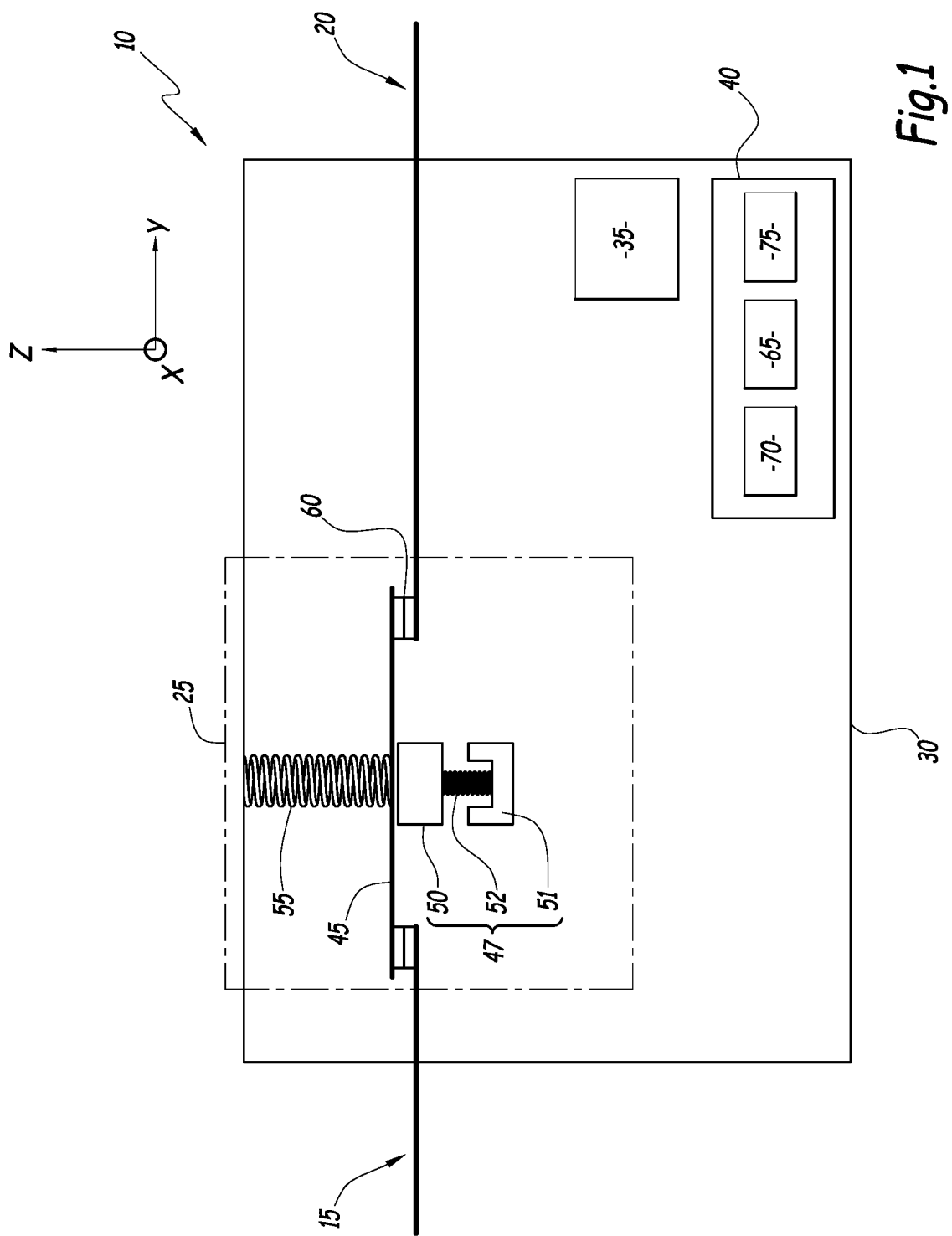
FIG. 1 is a diagrammatic representation of an electrical switching device according to a preferred embodiment of the invention, the connection member being electrically connected to the two connection lands.

A first example of a switching device 10 is shown in FIG. 1.

The switching device 10 is configured to receive an electrical current C from a first electrical conductor and to transmit the current C to a second electrical conductor. The switching device 10 is moreover configured to interrupt the passage of the electrical current C between the first and second electrical conductors.

The switching device 10 is for example a contactor. A contactor is a switching device configured to allow or to interrupt the passage of the electrical current C in response to a corresponding control signal. The corresponding control signal is for example an electrical or pneumatic signal sent by a remote control device of the switching device.

According to a variant, the switching device 10 is a circuit breaker configured to measure a value of an electrical parameter of the current C and to allow or to interrupt the passage of the current C as a function of the measured value.

The switching device 10 includes at least one input connection land 15, at least one output connection land 20, at least one connection member 25, a casing 30, an accelerometer 35 and a control 40.

According to the FIG. 1 example, the switching device 10 includes only one input connection land 15, only one output connection land 20 and only one connection member 25. It is to be noted that the number of input connection lands 15, of output connection lands 20 and of switching members 25 is liable to vary. For example, in one embodiment the switching device 10 is a three-phase switching device comprising three input connection lands 15, three output connection lands 20 and three switching members 25. According to a variant, a single connection member 25 is common to all the input and output connection lands 15, 20.

Three directions X, Y and Z of a reference frame linked to the switching device 10 are represented in FIG. 1. The three directions X, Y and Z are mutually perpendicular.

The input connection land 15 is configured to be connected to the first electrical conductor and to receive the electrical current C from the first conductor.

The output connection land 20 is configured for be connected to the second electrical conductor and to transmit the electrical current C to the second conductor.

According to the FIG. 1 example, each input or output connection land 15, 20 is a metal part configured to be connected to the corresponding electrical conductor at one end and to be in contact with the connection member 25 at another end. Alternatively, each connection land 15, 20 includes a set of interconnected electrically conductive parts.

The connection member 25 is mobile relative to the casing 30 and to the input and output connection lands 15, 20 between a closed position and an open position.

In FIG. 1, the connection member 25 is shown in its closed position. When the connection member 25 is in the closed position the connection member 25 allows the passage of the current C between the input and output connection lands 15, 20.

Figure 2:
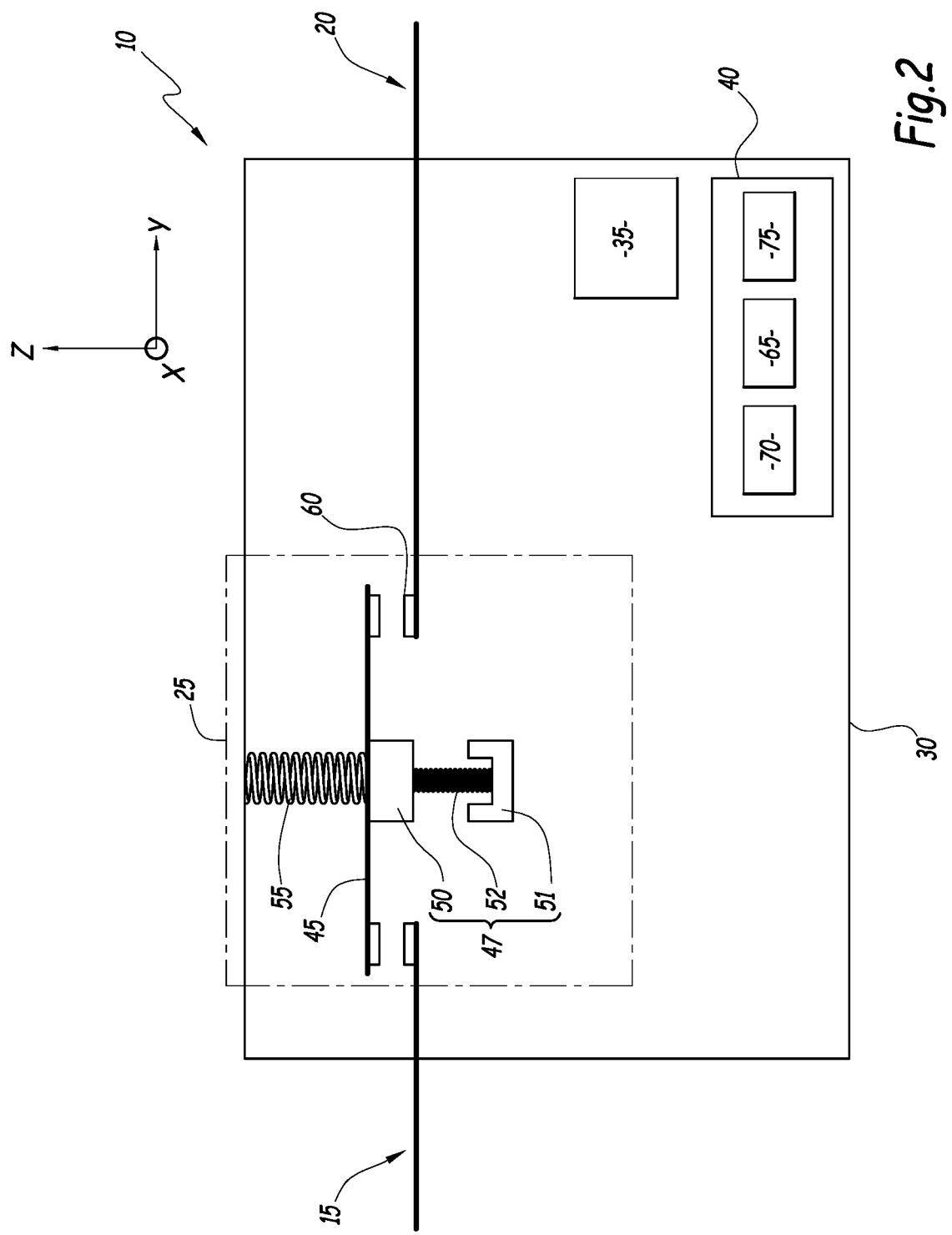
FIG. 2 is a diagrammatic representation of the switching device from FIG. 1 in the open position, the connection member being disconnected from the two connection lands.

In FIG. 2 the connection member 25 is shown in its open position. When the connection member 25 is in the open position the connection member 25 prevents the passage of the current C between the input and output connection lands 15, 20.

The connection member 25 is configured to switch between its open and closed position.

For example, if the switching device 10 is a contactor the connection member 25 is configured to switch between the open and closed positions following the reception of corresponding control signals. If the switching device 10 is a circuit breaker the connection member 25 is configured to switch between the open and closed positions as a function of the measured values of the parameter of the current C.

According to the FIG. 1 example, the connection member 25 includes a connection element 45, an actuator 47 and a pole spring 55.

The connection element 45 is mobile relative to the connection lands 15, 20 between a first position seen in FIG. 1 and a second position seen in FIG. 2. For example, the connection element 45 is mobile in translation in the direction Z between the first position and the second position.

When the connection member 25 is in the closed position the connection element 45 is in its first position and electrically connects the input and output connection lands 15, 20.

When the connection member 25 is in the open position the connection element 45 is in its second position and the input and output connection lands 15, 20 are electrically disconnected from one another. When the connection element 45 is in its second position, the connection element 45 bears against a corresponding abutment element, for example.

The connection element 45 is made of an electrically conductive material.

The connection element 45 carries two contact pads 60. The contact pads 60 are metal elements designed to be pressed by the connection element 45 against the corresponding input and output connection lands 15, 20 when the connection element 45 is in the first position.

According to the FIG. 1 example, contact pads 60 are also carried by the input and output connection lands 15, 20.

Each contact pad 60 has a thickness e measured in the direction Z.

The actuator 47 is configured to cause the connection member 25 to switch between the open position and the closed position. In particular, the actuator 47 is configured to move the connection element 45 between its first position and its second position.

The actuator 47 includes a mobile part 50, a fixed part 51 and a return spring 52.

The mobile part 50 is mobile between a third position seen in FIG. 1 and a fourth position seen in FIG. 2.

When the connection member 25 is in the closed position the actuator 50 is in the third position. When the mobile part 50 is in the third position the mobile part 50 is at a distance from the connection element 45. In particular, when the mobile part 50 is in the third position the mobile part 50 is not in contact with the connection element 45.

When the mobile part 50 is in the third position the mobile part bears against the fixed part 51, for example.

When the connection member 25 is in the open position the mobile part 50 is in the fourth position. When the mobile part 50 is in the fourth position the mobile part 50 bears against the connection element 45.

The mobile part 50 is configured to be moved between the third position and the fourth position. For example, the mobile part 50 includes a coil configured to generate a force tending to move the mobile part from the third position to the fourth position when an electrical current passes through the coil.

The mobile part 50 is configured, during its movement from the third position to the fourth position, to exert a force via the pole spring 55 on the connection element 45 to move the connection element 45 from the first position to the second position.

The return spring 52 is adapted to move the mobile part 50 from the third position to the fourth position.

The pole spring 55 is adapted to apply to the connection element 45 a force tending to move the connection element 45 from the second position to the first position.

The casing 30 is adapted to insulate the connection member 25 electrically from the exterior of the casing 30. The casing 30 is made of plastic material, for example.

The accelerometer 35 is adapted to measure at least one amplitude of a component c of an acceleration of the switching device 10 and in response to deliver an acceleration measurement signal Sm.

According to the preferred embodiment described in detail, the accelerometer 35 is configured to measure the three components c of the acceleration in the three directions X, Y and Z and in response to generate three corresponding measurement signals Smx, Smy, Smz.

According to the FIG. 1 example the accelerometer 35 is fastened to the casing 30. It is fixed directly to the casing 30, for example. Alternatively it is fixed to the circuit board receiving the control 40.

According to another embodiment the accelerometer 35 is fastened to the connection member 25 and consequently mobile relative to the casing 30. For example, the accelerometer 35 is fastened to the connection element 45.

The control 40 is configured to receive from the accelerometer 35 each acceleration measurement signal Smx, Smy, Smz.

The control 40 is configured to determine wear of the switching device 10 from at least the acceleration measurement signal Sm. For example, the control 40 is configured to estimate during switching of the connection member 25 between the closed position and the open position a switching duration Dc of the connection member 25 and to determine the wear on the basis at least of the switching duration Dc.

By "wear" is meant deterioration of a part of the switching device 10. For example, the control 40 is configured to determine wear of the switching member 25.

The wear is for example wear of the contact pads 60. A reduction of the thickness e of the contact pads 60 below a limit thickness is an example of wear of the switching member 25. It is to be noted that other types of wear can be determined.

The control 40 is fastened to the casing 30, for example.

The control 40 includes a processor 65, a memory 70 and a signalling module 75.

A computer program is stored in the memory 70. The computer program includes software instructions which, when they are executed on the processor 65, implement a method of detecting wear of the switching device 10.

The signalling module 75 is configured to transmit to a user of the switching device 10 a detection signal indicating to the user that wear of the switching device 10 has been detected. For example, the signalling module 75 includes a light emitter visible through an opening in the casing 30 that is lit to indicate that wear has been detected.

According to a variant, the signalling module 75 is configured to transmit a detection signal Su to a remote device configured to display an alert to the user, for example by a cable connection or by a radio link, for example of short-range RFID type.

The operation of the switching device 10 is described next.

Figure 3:
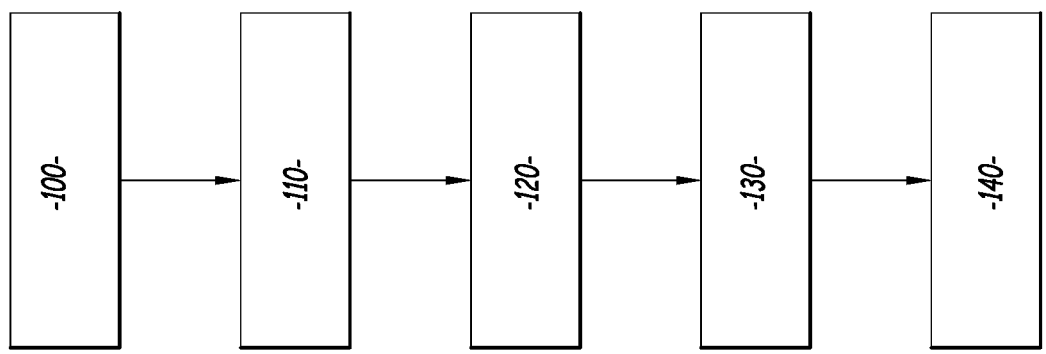
FIG. 3 is a flowchart of the steps of an example of the wear detection method for the switching device from FIG. 1.

A flowchart of the steps of a wear detection method implemented by the electrical switching device 10 is shown in FIG. 3.

The method comprises a calibration step 100, a switching step 110, a measurement signal generation step 120, a switching duration estimation step 130 and a wear determination step 140.

During the calibration step 100 at least one switching operation of the connection member 25 is executed. For example, at least ten switching operations of the connection member 25 are executed.

Each switching operation is for example a movement of the switching member 25 from the closed position to the open position. Alternatively, each switching operation is a movement of the switching member 25 from the open position to the closed position.

During each switching operation, the mobile part 50 is moved from its third position to its fourth position. When the mobile part 50 comes into contact with the connection element 45 the mobile part 50 exerts on the connection element 45 a force tending to move the connection element 45 from its first position to its second position.

A start of travel time T1, an end of travel time T2 and an end of bearing time T3 are defined for each switching operation.

The start of travel time T1 is the time at which the mobile part 50 starts to be moved from the third position to the fourth position. The end of travel time T2 is the time at which the connection element 45 arrives in the second position. For example, the end of travel time T2 is the time at which the connection element 45 abuts against the corresponding abutment element.

The end of bearing time T3 is the time at which the mobile part 50 comes into contact with the connection element 45 to move the connection element 45 to the second position. Before the end of bearing time T3 the connection element 45 bears against the input and output connection lands 15, 20 and is immobile relative to the two connection lands 15, 20.

During each switching operation the values of the three components c of the acceleration in the directions X, Y and Z are measured by the accelerometer 35.

An acceleration measurement signal Smx, Smy, Smz is generated by the accelerometer 35 for each component c of the acceleration. Each measurement signal Smx, Smy, Smz is an analogue or digital signal representing the value of the measured acceleration component.

Each acceleration measurement signal Sm has an amplitude depending on the value of the measured acceleration component c.

According to one embodiment, at least one filtering operation is applied to each acceleration measurement signal Sm.

For example, low-pass filtering is applied to each acceleration measurement signal Sm. The low-pass filtering has a cut-off frequency greater than or equal to 500 Hertz (Hz).

Instead or in addition to this, high-pass filtering is applied to each acceleration measurement signal Sm. The high-pass filtering has a cut-off frequency greater than or equal to 5 Hz.

Figure 4:
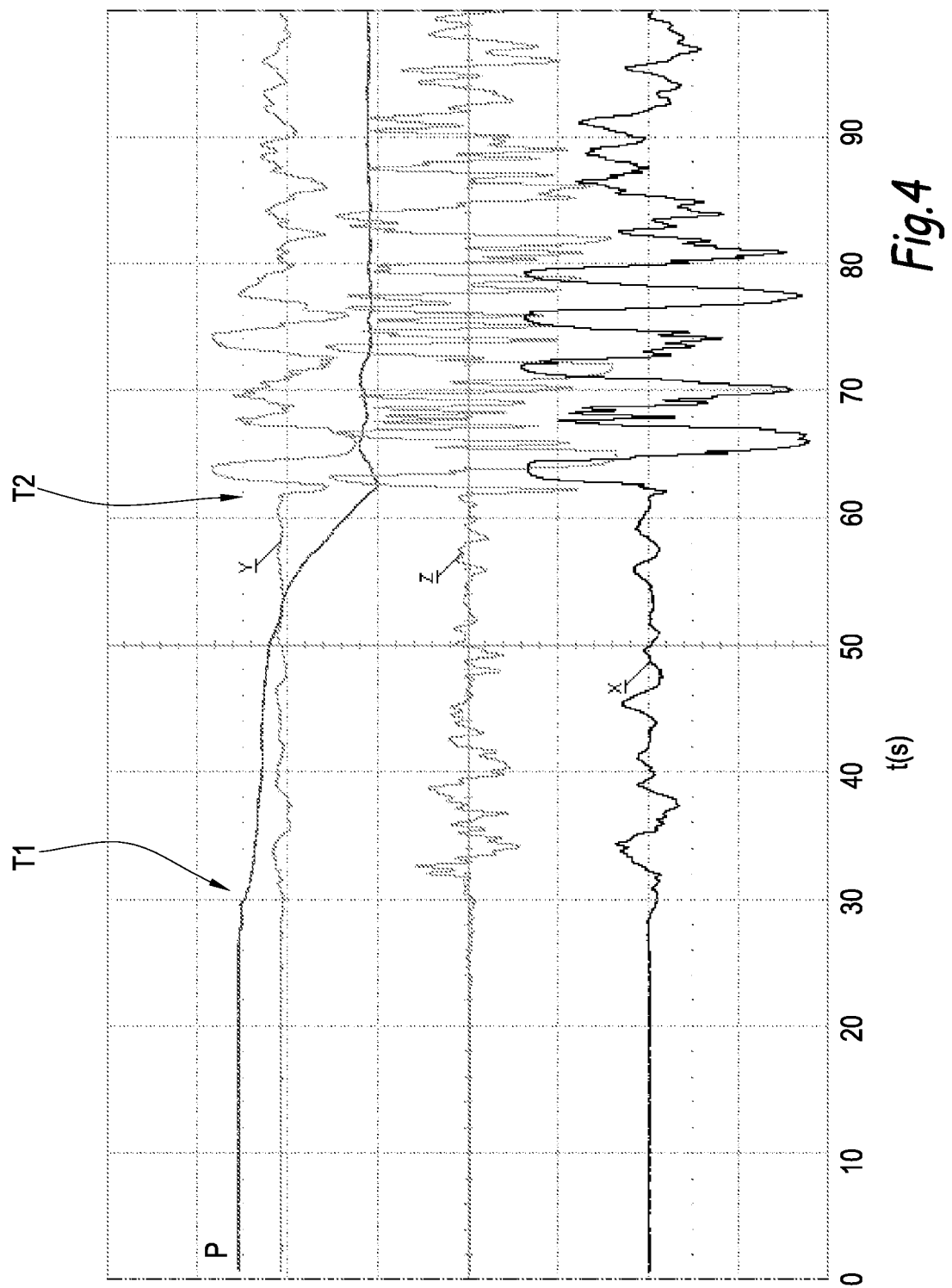
FIG. 4 is a graph representing the variation with time of the position of the connection member and of three components of the acceleration of the switching device during a switching operation.

The variation of the amplitude of each acceleration measurement signal Smx, Smy, Smz during a switching operation of the connection member 25 as a function of time tin milliseconds is shown in FIG. 4.

The variation of the position of the mobile part 50 is also shown in FIG. 4 by a curve P showing the start of travel time T1 and the end of travel time T2.

Characteristic signatures of the start of travel time T1 and the end of travel time T2 of the switching member 25 are identified in the acceleration measurement signals Smx, Smy, Smz generated during the switching operations of the calibration phase.

By "signature" is meant a characteristic or a set of characteristics of one or more acceleration measurement signals reproducibly associated with a given event.

For example, in FIG. 4 a signature of the start of travel time T1 is the appearance of a non-zero signal on the curve Smx representing the amplitude of the acceleration component in the direction X.

Moreover, a signature of the end of travel time T2 is the appearance after the start of travel time T1 in the curve Smy representing the amplitude of the acceleration component in the direction Y of a minimum the absolute value of which is much higher than the absolute values of the amplitudes of the acceleration component in the direction Y before the end of travel time T2.

The calibration step 100 is executed for example on a single electrical switching device 10, the signatures identified being thereafter used in all the switching devices 10 manufactured to identify the start and end of travel times T1 and T2.

The calibration step 100 is executed in the factory, for example.

The switching step 110, generation step 120, estimation step 130 and determination step 140 are iterated for each switching device 10 during its use in an electrical installation or in an electricity distribution network.

The switching step 110 includes an operation of switching the connection member 25 between its closed position and its open position. The switching is for example controlled remotely by the user according to the requirements of the electrical installation or of the electricity distribution network into which the switching device 10 is integrated.

The generation step 120 and the estimation step 130 are executed during each switching operation of the connection member 25 of each installed switching device 10. According to a variant, the generation step 120 and the estimation step are executed for only some switching operations, for example every ten switching operations, or following a minimum time period from the last execution of those steps.

During the generation step 120 three measurement signals Smx, Smy, Smz corresponding to the acceleration components in the three directions X, Y and Z are generated.

During the estimation step 130 at least one switching duration Dc of the connection member 25 is estimated. For this, the start of travel time T1 and the end of travel time T2 are detected.

The switching duration Dc is estimated on the basis of the start of travel time T1 and the end of travel time T2. In particular, the switching duration Dc is delimited by the start of travel time T1 and by the end of travel time T2.

The start of travel time T1 and the end of travel time T2 are detected by comparing the acceleration measurement signals Smx, Smy, Smz generated during the switching step with the corresponding signatures obtained in the calibration phase.

For example, the start of travel time T1 is identified by comparing the acceleration signal Smx to a corresponding signature. According to one particularly simple embodiment, the signature is the overshooting of a first threshold. The control 40 therefore compares to the first threshold the amplitude of the acceleration signal Smx. The first threshold is for example equal to one third of the total measurement range of the accelerometer 35.

When the amplitude of the acceleration signal Smx overshoots the first threshold the control 40 detects the start of travel time T1.

The end of travel time T2 is identified by comparing the acceleration signal Smy to a corresponding signature. In one particularly simple embodiment the end of travel time T2 is the overshooting of a second threshold after the start of travel time T1. The control 40 therefore compares to the second threshold the amplitude of the acceleration signal Smy. The second threshold is for example equal to one third of the total measurement range of the accelerometer 35.

When the amplitude of the acceleration signal Smy becomes equal to or greater than the second threshold after the start of travel time T1 has been detected, the control 40 detects the end of travel time T2. According to the FIG. 4 example, it is the absolute value of the amplitude of the acceleration signal Smy that becomes equal to or greater than the second threshold at the end of travel time T2.

The control 40 estimates the switching duration Dc by calculating the difference between the start of travel time T1 and the end of travel time T2.

During the determination step 140 the wear of the switching device 10 is determined on the basis of the switching duration Dc.

For example, the control 40 compares the switching duration Dc to a third predetermined threshold and determines the wear of the switching device 10 if the switching duration Dc is greater than or equal to the third threshold. The third threshold is for example between 5 milliseconds (ms) and 40 ms inclusive.

In particular, if the switching duration Dc is greater than or equal to the third threshold the control 40 determines that the wear is greater than or equal to a predetermined wear threshold. The wear threshold corresponds for example to a thickness of the contact pads 60 below which correct operation of the electrical switching device 10 is threatened.

When the control 40 determines that the switching device 10 is worn, the control 40 commands the signalling module to send a signal to the user of the switching device.

Thanks to the use of the accelerometer wear of the switching device 10 is determined effectively. Accordingly, preventive maintenance and replacement of worn parts in good time are facilitated, which limits the risk of malfunctioning of the switching device 10. The switching device 10 is therefore safer, likewise the electrical installation or the electricity distribution network in which the switching device 10 is installed.

Moreover, the detection of wear by an accelerometer is compatible with a large number of applications, including applications at high voltages of 380 Volt or more.

Detecting the start and end of travel times T1, T2 by comparing the amplitude of the acceleration measurement signal Smx, Smy, Smz to thresholds is easy to implement in the control 40 and requires little computing power.

Determining wear if the switching duration Dc exceeds a corresponding threshold enables some wear to be detected simply and effectively. In particular, wear of the contact pads 60 leading to an excessive reduction of the thickness e or even to direct contact between the connection element 45 and the corresponding connection land 15, 20 leads to an increase in the travel distance of the switching member and therefore to an increase in the switching duration Dc. Such wear is therefore effectively determined by comparing the switching duration Dc to a threshold.

When the accelerometer 35 is fastened to the casing 30, the connection of the accelerometer 35 to the control 40 is facilitated. For example, the accelerometer 35 can be integrated onto the same electronic circuit card as the control 40.

When the accelerometer 35 is fastened to the switching member 25 the measured acceleration amplitude is higher and the wear detection method is therefore more accurate.

Thanks to the filtering applied, low-frequency and high-frequency interfering signals are eliminated, which prevents the detection of false positives.

The first example of a switching device 10 and the associated detection method described above have been described in the situation of a particular type of connection member 25 the connection element of which is mobile in translation relative to the direction Z that is one of the directions in which the accelerometer 35 is configured to measure an acceleration component c. It is to be noted that other types of connection member 25 may be used and that the accelerometer 35 can be oriented differently relative to the movement of the connection member 25. The signatures used for detecting the start and end of travel times T1, T2 are therefore liable to vary from one switching device design to another.

It is also to be noted that the signatures identified are also liable to vary as a function of the position and of the orientation of the accelerometer 35 in the switching device 10.

For example, in some switching device designs the signatures of the start and end of travel times T1, T2 are liable to be detected in the same acceleration measurement signal Sm corresponding to an acceleration component in a direction X, Y or Z.

It is also to be noted that different types of wear may be determined. For example, wear of the contact pads 60 is determined on the basis of the acceleration measurement signals Sm corresponding to the two directions X and Y and wear of a part other than the contact pads 60 is determined on the basis of the identification of a signature detected in the acceleration measurement signal Sm corresponding to the direction Z.

Jamming of or excessive friction on the mobile part 50 are other examples of wear that maybe detected.

A second example of a switching device 10 is described next. Elements identical to those of the first example from FIGS. 1 to 4 are not described again. Only the differences are highlighted.

Each acceleration measurement signal Sm includes a set of frequency components. Each frequency component has an intensity.

The control 40 is configured to detect on the basis of at least one acceleration measurement signal the end of bearing time T3 and to detect wear on the basis of the detected end of bearing time T3.

The control 40 is moreover configured to estimate the intensity of at least two frequency components. For example, the control 40 is configured to estimate continuously the intensity of each frequency component from a range of predetermined frequencies during a switching operation.

Different methods may be used by the control 40 to estimate the intensity of the frequency components. According to one embodiment, the control 40 is configured to effect a frequency decomposition of the acceleration measurement signal Sm, for example using a "short-term Fourier transform" type method.

The control 40 is configured to detect at least one start or end of travel time T1, T2 or end of bearing time T3 by detection comparison of the measurement signal Sm with a corresponding signature, the signature being a function of the intensities of at least two frequency components.

For example, the control 40 is configured to detect in the frequency breakdown of the acceleration measurement signal a range of frequencies over which the intensity of each frequency component is greater than or equal to a fourth threshold. According to one embodiment, the end of bearing time T3 is detected when, over a predetermined continuous frequency range, each frequency component has an intensity greater than or equal to the fourth threshold.

Figure 5:
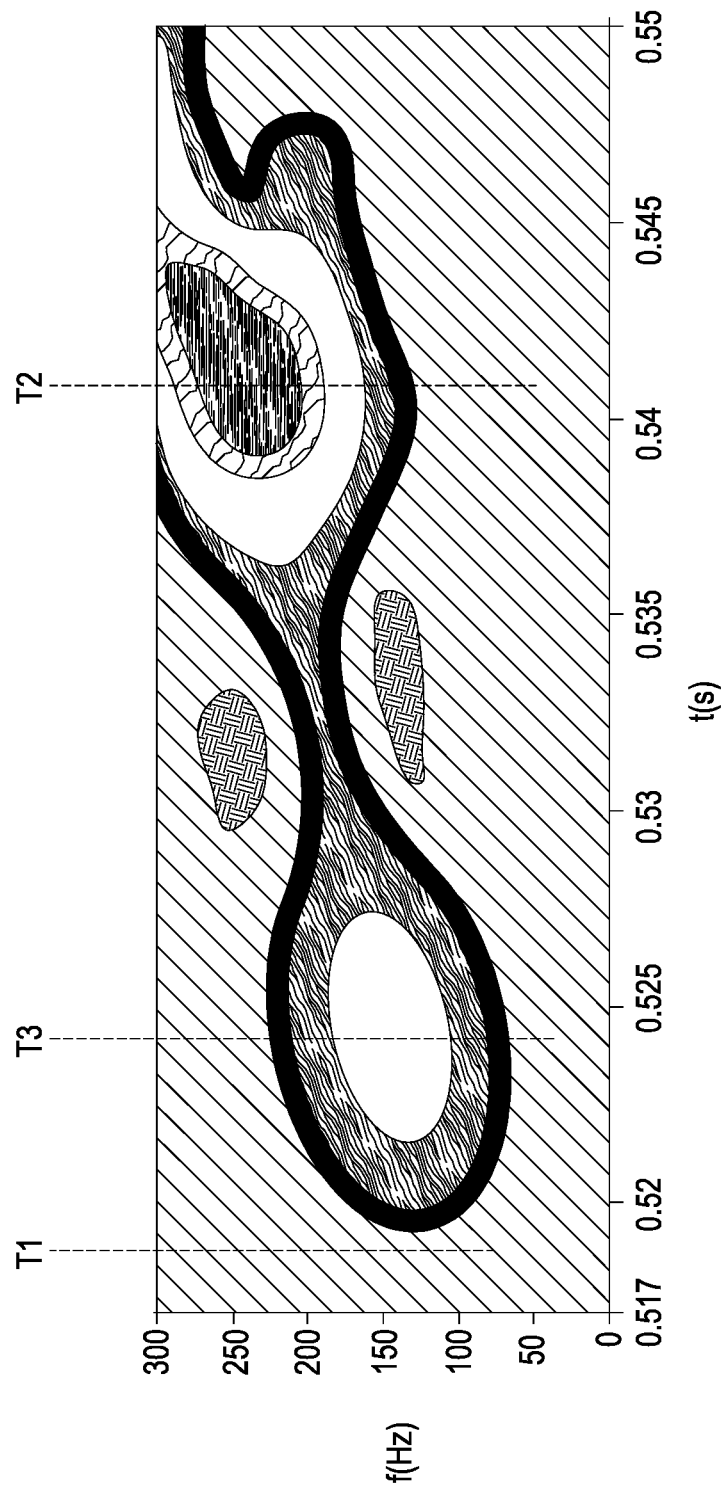
FIG. 5 is a graph representing a switching device acceleration measurement signal as a function of frequency during a switching operation.

Accordingly, in FIG. 5 the variation of the amplitude of the various frequency components of the measurement signal Sm in the direction Y during a switching operation a is shown and is a function of the frequency f of each frequency component and of time t in milliseconds. The start and end of travel times T1, T2 and the end of bearing time T3 are highlighted.

In FIG. 5 it seen that the end of bearing time T3 is effectively detected when the intensity of each frequency component between 100 Hz and 200 Hz inclusive is greater than or equal to the fourth threshold.

Alternatively, the end of bearing time T3 corresponds to the moment at which the minimum intensity of all the components from the predetermined range of frequencies reaches a maximum.

According to another variant, two times T1, T2 or T3 are identified by the computer 40 by comparing the intensities of two different frequency components to two different thresholds. According to the FIG. 5 example, the end of bearing time T3 is detected when the intensity of the 150 Hz frequency component is at a maximum and the end of travel time T2 is detected when the 250 Hz frequency component has a maximum intensity.

The analysis of the frequency components of the measurement signal Sm enables effective detection of the end of bearing time T3. The time duration between the start of travel time T1 and the end of bearing time T3 also correlates with the wear of the pads 60.

Moreover, the signature of the end of bearing time T3 is liable to vary as a function of the wear of the contact pads 60. For example, pronounced wear of the contact pads 60 is liable to lead to a reduction of the maximum intensity of the more intense frequency components and to an increase in the maximum intensity of the other frequency components. In other words, the more worn the contact pads 60, the wider and the less intense the mark seen at the time T3 in FIG. 5.

The above first and second examples have been described in the situation where the control 40 includes a processor and a memory in which software instructions are stored. It is to be noted that the functionalities of the control 40 are equally liable to be implemented in the form of programmable logic circuits or one or more application-specific integrated circuits. For example, the control 40 includes a module for detecting the start of travel time T1, a module for detecting the end of travel time T2, a module for detecting the end of bearing time T3, a module for estimating the switching duration Dc, a module for comparing the switching duration Dc to a threshold and a module for determining wear.

It is also to be noted that in some embodiments the control 40 is liable to be situated outside the casing 30, for example in a situation where the control 40 receives by radio, for example RFID type, communication or cable communication the acceleration measurement signals Sm generated by the accelerometer 35. In this case, a controller 40 is liable to be shared by a plurality of switching devices 10.

The invention corresponds to any technically possible combination of the embodiments described above.

The invention claimed is:

1. An electrical switching device comprising:
   at least one input connection land;
   at least one output connection land;
   at least one connection member capable of switching between a closed position allowing an electric current to flow between the input and output connection lands and an open position preventing the flow of the electrical current between the input and output connection lands;
   an accelerometer configured to measure at least one component of an acceleration of the electrical switching device when switching the connection member between the closed position and the open position; and
   a processor configured to estimate, on the basis of at least one acceleration measurement signal delivered by the accelerometer, a duration of switching the connection member between the closed position and the open position and to determine wear on the electrical switching device on the basis of at least the estimated switching duration,
   wherein the processor is configured to detect, when the connection member switches between the closed position and the open position, a start of travel time and an end of travel time of the travel of the connection member based on an amplitude of the acceleration measurement signal and to estimate the switching duration on the basis of the detected start of travel and end of travel times.

2. The electrical switching device according to claim 1, wherein the processor is configured to determine wear on the switching device if the switching duration is greater than or equal to a predetermined threshold.

3. The electrical switching device according to claim 1, wherein the processor is configured to verify if the determined wear is greater than a predetermined wear threshold and if so to generate a detection signal intended for a user of the electrical switching device.

4. The electrical switching device according to claim 1, including a casing for electrically insulating the connection member from the exterior of the casing, the connection member being mobile relative to the casing between its open position and its closed position, and wherein the accelerometer is fastened to the casing.

5. The electrical switching device according to claim 1, including a casing for electrically insulating the connection member from the exterior of the casing, the connection member being mobile relative to the casing between its open position and its closed position, and wherein the accelerometer is fastened to the connection member and consequently mobile relative to the casing.

6. The electrical switching device according to claim 1, wherein the processor is configured to compare the amplitude of the acceleration measurement signal to a first threshold and to detect the start of travel time if the amplitude overshoots the first threshold.

7. The electrical switching device according to claim 6, wherein the processor is configured to compare the amplitude of an acceleration measurement signal to a second threshold and to detect the end of travel time if, after a start of travel time has been detected, the amplitude becomes greater than or equal to the second threshold.

8. The electrical switching device according to claim 1, wherein the connection member comprises a connection element and an actuator, the connection element being mobile relative to the connection lands between a first position and a second position and being configured to connect electrically the two connection lands when the connection element is in the first position and to disconnect electrically the two connection lands when the connection element is in the second position,
   the actuator comprising at least one part mobile relative to the connection lands between a third position and a fourth position, the mobile part being in the third position and the connection element being in the first position when the connection member is in the closed position, the mobile part being in the fourth position and the connection element being in the second position when the connection member is in the open position,
   the mobile part being configured to be at a distance from the connection element when the mobile part is in the third position and being configured, during its movement from the third position to the fourth position, to come to bear against the connection element to move the connection element from the first position to the second position, the processor being furthermore configured to detect on the basis at least of the acceleration measurement signal an end of bearing time of the mobile part against the connection element, the wear being determined furthermore on the basis of the detected end of bearing time.

9. The electrical switching device according to claim 8, wherein the acceleration measurement signal comprises a set of frequency components each having an intensity, the processor being configured to detect the end of bearing time when, over a continuous range of frequencies having a predetermined frequency width, the intensity of each frequency component is greater than or equal to a third predetermined threshold.

10. The electrical switching device according to claim 1, wherein the switching device is a contactor.

11. A wear detection method for an electrical switching device comprising an accelerometer, at least an input connection land, an output connection land and a connection member, capable of switching between a closed position allowing an electric current to flow between the input and output connection lands and a closed position preventing the flow of the electrical current, comprises the steps of:

switching the connection member between the closed position and the open position, the accelerometer generating an acceleration measurement signal corresponding at least to a component of an acceleration of the switching device during switching, estimating on the basis of the acceleration measurement signal a switching duration of the connection member between the closed position and the open position, and determining wear of the switching device on the basis at least of the estimated switching duration, wherein the method includes detecting, when the connection member switches between the closed position and the open position, a start of travel time and an end of travel time of the travel of the connection member based on an amplitude of the acceleration measurement signal and estimating the switching duration on the basis of the detected start of travel and end of travel times.

12. The wear detection method according to claim 11, further comprising a calibration step including generating an acceleration measurement signal during at least one switching operation and identifying in the acceleration measurement signal supplied by the accelerometer at least one signature of a start of travel or end of travel time of the connection member, the estimation step including the detection of a start of travel time or an end of travel time of the connection member by comparing the acceleration measurement signal generated during the generation step with the identified signature.

* * * * *